(12) United States Patent
Lebron

(10) Patent No.: US 10,828,852 B1
(45) Date of Patent: Nov. 10, 2020

(54) EMBEDDING ELECTRONICS IN HOUSING USING ADDITIVE MANUFACTURING

(71) Applicant: Honeywell International Inc., Morris Plains, NJ (US)

(72) Inventor: Pedro Luis Lebron, San Antonio, PR (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 16/545,390

(22) Filed: Aug. 20, 2019

(51) Int. Cl.
| | |
|---|---|
| *B29C 70/74* | (2006.01) |
| *B29C 64/10* | (2017.01) |
| *B33Y 10/00* | (2015.01) |
| *B33Y 80/00* | (2015.01) |

(52) U.S. Cl.
CPC ............ *B29C 70/742* (2013.01); *B29C 64/10* (2017.08); *B33Y 10/00* (2014.12); *B33Y 80/00* (2014.12)

(58) Field of Classification Search
CPC .............................. B26C 70/742; B29C 64/10
See application file for complete search history.

(56) References Cited

U.S. PATENT DOCUMENTS

| | | | | |
|---|---|---|---|---|
| 5,548,083 A | * | 8/1996 | Yamamoto | B29C 51/267 174/382 |
| 5,755,915 A | * | 5/1998 | Yamamoto | G06F 1/182 156/285 |
| 9,555,582 B2 | * | 1/2017 | Javidan | B29C 64/106 |
| 9,559,038 B2 | * | 1/2017 | Schmit | H01L 23/10 |
| 9,559,508 B2 | * | 1/2017 | Shepard | H05K 7/1432 |
| 9,564,385 B2 | * | 2/2017 | Schmit | H01L 23/3675 |
| 2013/0170171 A1 | | 7/2013 | Wicker et al. | |
| 2015/0101838 A1 | * | 4/2015 | Shepard | H02G 5/06 174/50 |
| 2019/0249929 A1 | * | 8/2019 | Rush | B33Y 80/00 |
| 2019/0322044 A1 | * | 10/2019 | Susnjara | B29C 64/209 |

(Continued)

FOREIGN PATENT DOCUMENTS

| | | |
|---|---|---|
| KR | 20170011719 A | 2/2017 |
| KR | 101753962 B1 | 7/2017 |

OTHER PUBLICATIONS

"3D Printed IOT enclosure casing for electronics", Designifying, Nov. 10, 2018, pp. 1-3.

(Continued)

*Primary Examiner* — Lisa Lea-Edmonds
(74) *Attorney, Agent, or Firm* — Fogg & Powers LLC

(57) ABSTRACT

Systems and methods for embedding electronics in a housing using additive manufacturing are provided. In certain embodiments, a system includes a housing made using an additive manufacturing process. The system also includes at least one electronics assembly that is embedded into the housing during the additive manufacturing process, wherein one or more electronic components on the at least one electronic assembly are isolated from the material used to form the housing. Further, the system includes an electrical connector coupled to at least one electronic component in the one or more electronic components, wherein the electrical connector provides an electrical connection between the at least one electronic assembly and system electronics that are outside the housing, wherein the electronic assembly is environmentally sealed within the housing from the environment outside the housing.

10 Claims, 4 Drawing Sheets

(56) References Cited

U.S. PATENT DOCUMENTS

2019/0358850 A1\* 11/2019 Yang .................. F01D 5/187
2019/0373738 A1\* 12/2019 Kozlovski ............. H05K 3/207
2020/0057088 A1\* 2/2020 Lebron .................. G01P 1/02

OTHER PUBLICATIONS

Lebron, Pedro Luis et al., "Isolating Sensor Assembly Using Elastic Material"; U.S. Appl. No. 16/105,772, filed Aug. 20, 2018; pp. 1-31; Published: US.

Mendoza, "Ultrasonic 3D Printing Allows for Electronics to be Embedded in Metal via Sound", Aug. 17, 2014, pp. 1-5, 3DR Holdings, LLC.

\* cited by examiner

EMBEDDING ELECTRONICS IN HOUSING USING ADDITIVE MANUFACTURING

BACKGROUND

Electronic applications today may include multiple different electronic assemblies that function together to accomplish the purposes of the larger system or application. Frequently, these different electronic assemblies are provided for use in the system within packages, such as a chassis/housing. The electronic assemblies are frequently mounted within the housing by placing the electronic assembly between multiple housing components, securing the electronic assembly to one or more of the housing components, and then securing the housing components to one another.

SUMMARY

Systems and methods for embedding electronics in a housing using additive manufacturing are provided. In certain embodiments, a system includes a housing made using an additive manufacturing process. The system also includes at least one electronics assembly that is embedded into the housing during the additive manufacturing process, wherein one or more electronic components on the electronic assembly are isolated from the material used to form the housing. Further, the system includes an electrical connector coupled to at least one electronic component in the one or more electronic components, wherein the electrical connector provides an electrical connection between the electronic assembly and system electronics that are outside the housing, wherein the electronic assembly is environmentally sealed within the housing from the environment outside the housing.

DRAWINGS

Understanding that the drawings depict only some embodiments and are not therefore to be considered limiting in scope, the exemplary embodiments will be described with additional specificity and detail using the accompanying drawings, in which.

Figure 4:
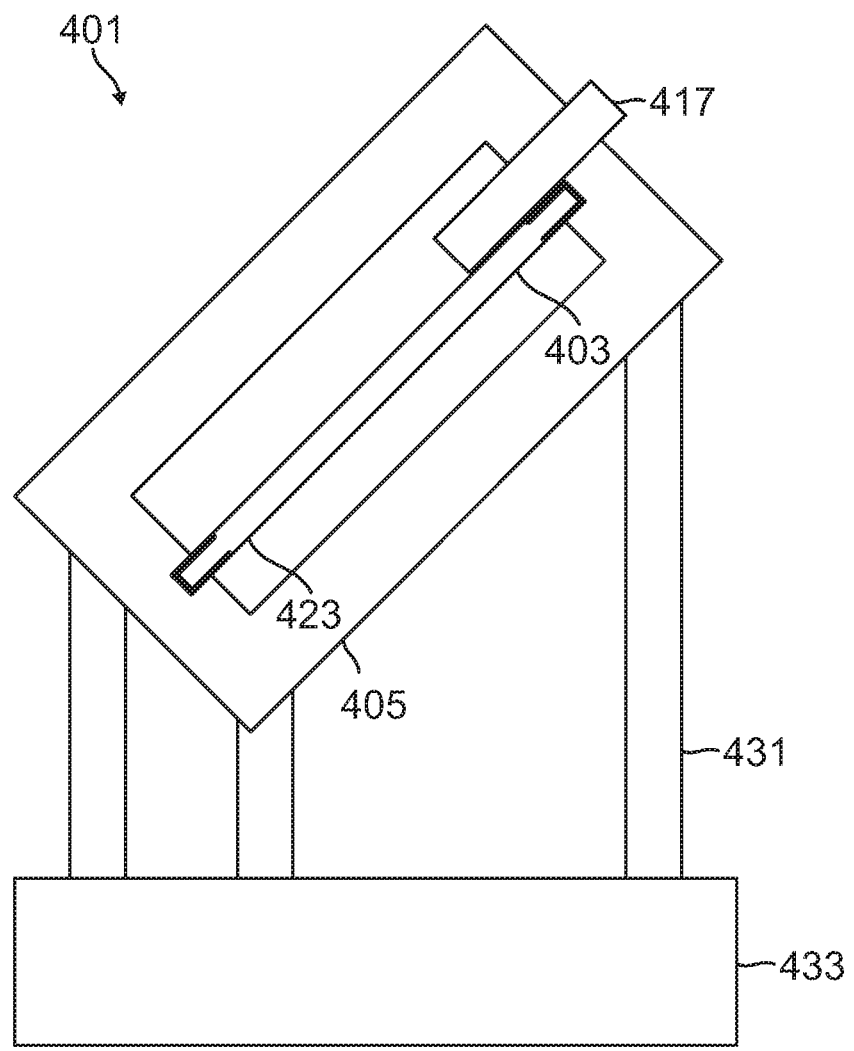
Figure 5:
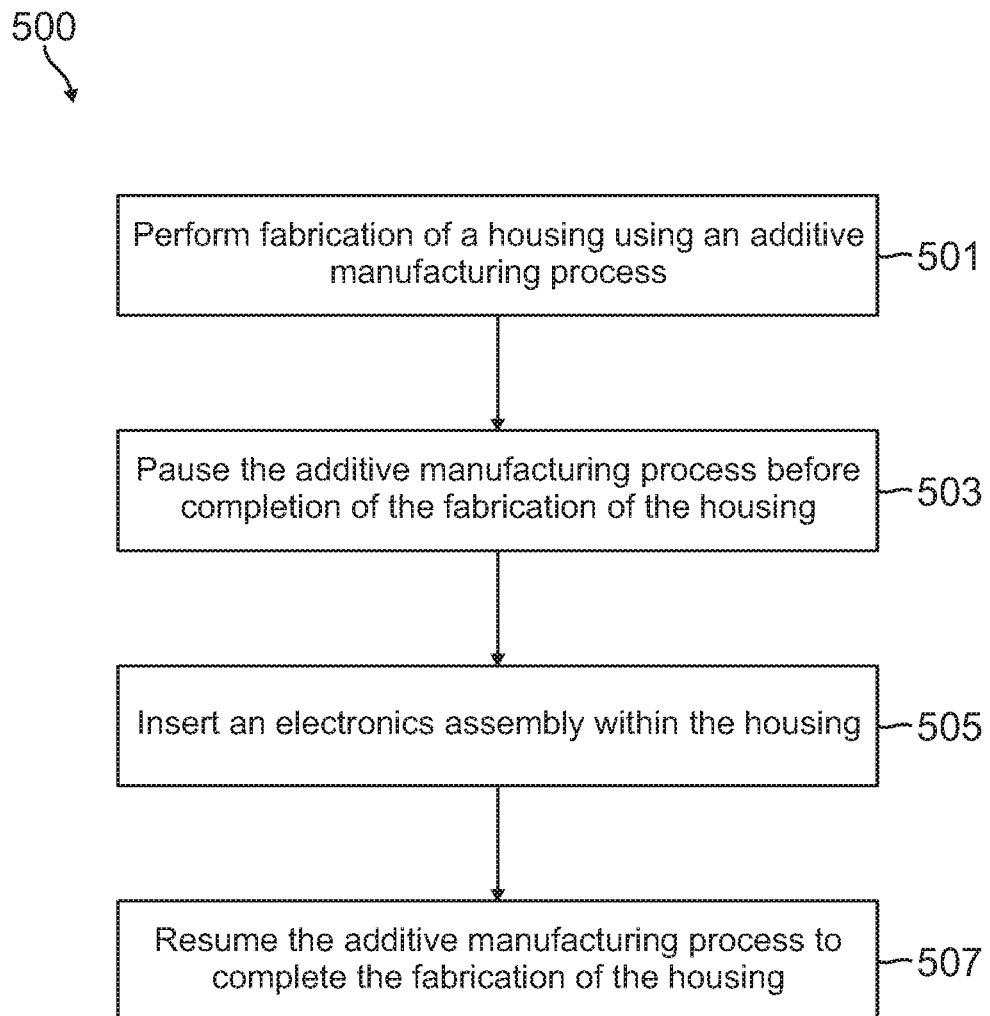

FIG. 4 is a diagram illustrating a possible orientation of a housing containing an electronic assembly during the performance of an additive manufacturing process according to an aspect of the present disclosure; and FIG. 5 is a flowchart diagram of an exemplary method for mounting an electronic assembly within the housing fabricated using additive manufacturing technology according to an aspect of the present disclosure.

In accordance with common practice, the various described features are not drawn to scale but are drawn to emphasize specific features relevant to the example embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made.

Systems and methods described herein provide for embedding electronics in a housing, where the housing is fabricated using an additive manufacturing process. In certain embodiments, fully assembled electronics may be embedded within a housing using an additive manufacturing process. For example, during the fabrication of a housing using an additive manufacturing process, at a certain point during the build process for the housing, the fabrication process may be paused. When the fabrication process is paused, an electronic assembly may be inserted into the partially constructed housing. With the electronics placed within the partially constructed housing, the build process for the housing may proceed to completion. When the process is completed, the electronic assembly may be embedded within the fabricated housing. By embedding the electronic assembly within the housing, the housing may be smaller while providing additional benefits that include the environmental sealing of the electronic assembly within the housing.

Figure 1:
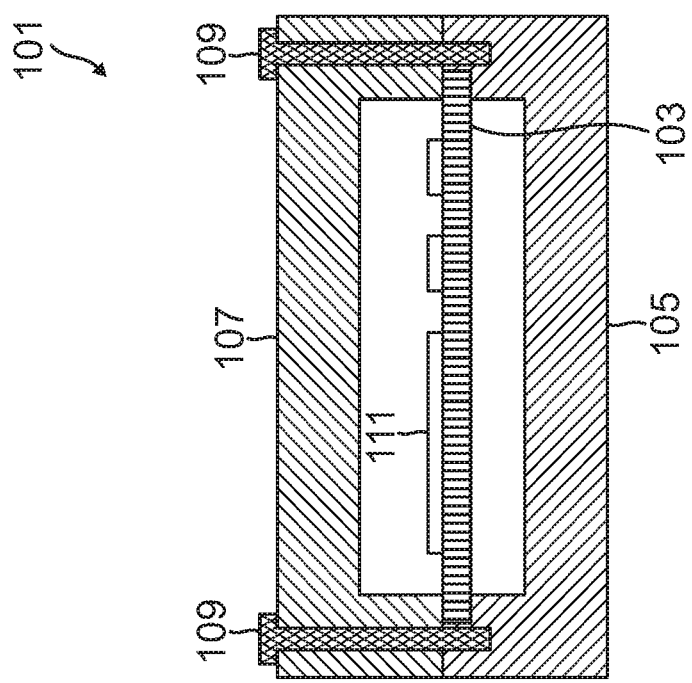
FIG. 1 is a cross-section diagram illustrating an electronic assembly mounted within a housing comprised of multiple components according to an aspect of the present disclosure.

FIG. 1 is a cross-section diagram illustrating a system 101 that includes an electronic assembly 103. As used herein, the electronic assembly 103 may refer to an object that uses electricity in providing a desired function. In some examples, the electronic assembly 103 may be a printed board assembly (PBA). In particular, the electronic assembly 103 may be a circuit board that mechanically supports and/or provides electrical connections between various electronic components 111 that are affixed to the circuit board. The electronic components 111 may include various chips (e.g., integrated circuit(s) in a plastic housing) and/or discrete components (e.g., resistors, capacitors, inductors, etc.). The electronic assembly 103 may be multi-layered with one or more conductive layers and one or more non-conductive layers. Moreover, the electronic assembly 103 may include one or more pads, ports, electrically-coupling solder deposits, conductive traces, vias, through-holes between layers, superficial printed characters, and the like.

In some embodiments, the electronic components 111 mounted on the electronic assembly 103 may include one or more micro-electro-mechanical systems (MEMS) devices. In applications, where the MEMS device(s) are sensors, a MEMS device may detect characteristics of the environment, such as magnetic fields, acceleration, and/or rotation. For example, a MEMS sensor may include one or more MEMS devices and be part of an inertial measurement unit (IMU). An IMU may include three accelerometers that aid in measuring acceleration along three orthogonal axes, and three gyroscopes that provide measurements of rotation about three orthogonal axes. In addition to providing inertial measurements using MEMS devices, the electronic assembly 103 may include other components 111 that may aid the function of the MEMS sensor that are located on the top surface and/or the bottom surface of the electronic assembly 103. As used herein, top and bottom are relative terms. For example, the use of top and bottom denotes that the components 111 may be located on opposite sides of the electronic assembly 103.

In certain embodiments, the system 101 may include a housing. The electronic assembly 103 may be mounted within the housing, where the electronic assembly 103 is secured within multiple housing components. For example, the housing may include at least a first component 105 and a second component 107. While not shown, the housing may include any multiple number of housing components.

During assembly of the system 101, the electronic assembly 103 may be placed or seated within the first component 105. When the electronic assembly 103 is seated within the first component 105, the second component 107 may be placed over the electronic assembly 103 and joined to the first component 105. When the second component 107 is joined to the first component 105, the first component 105 and the second component 107 form a housing that encloses the electronic assembly 103.

When the various components of the housing (such as the first component 105 and the second component 107) are joined to one another, the multiple components may be secured to one another using fastening devices 109. For example, the first component 105 may be fastened to the second component 107 using the fastening devices 109. The fastening devices 109 may be screws or bolts that are threaded through one or more holes in the components of the housing, such that as the screws or bolts are tightened, the components of the housing press tightly against one another to secure the electronic assembly 103 within the housing. For instance, as the screws or bolts are tightened, the first component 105 and the second component 107 press tightly against both each other and portions of the electronic assembly 103, such that the electronic assembly 103 is secured within the housing. Additional fastening devices may be used to secure the electronic assembly 103 within the housing such as clamps, adhesives, elastic material, structural keys, and the like. Additionally, elastomeric material may be placed between proximal surfaces of the various components to aid in environmentally sealing the electronic assembly 103 within the housing. For example, O-rings may be placed between the first component 105 and the second component 107 to provide an environmentally seal for protecting the electronic assembly 103 from the environment that is outside the housing.

As shown in FIG. 1, the housing has two or more components that are fastened together to provide environmental protection for the electronic assembly 103. As described above, to fasten the components of the housing to one another, the system 101 may include some fastening devices 109. The use of fastening devices 109 or other means to secure the various components of the housing to one another may and additional materials to seal the joints between the components may have the effect of increasing the size, weight, and complexity of the housing. Of particular concern are the size and weight of the housing. Certain applications have size and weight limitations and, accordingly, the size and weight of the housing may affect the use of the electronic assembly 103 or other desired electronics in applications subject to size and weight limitations. For example, in some aerospace applications, the weight of a system may be critical. Examples of applications that strive for limited size may include, but are not limited to, wearable applications, gas/oil applications, mobile devices, and the like. Accordingly, it is desirable to design a housing that allows for a smaller weight and size while still providing the desired functionality.

Figure 2:
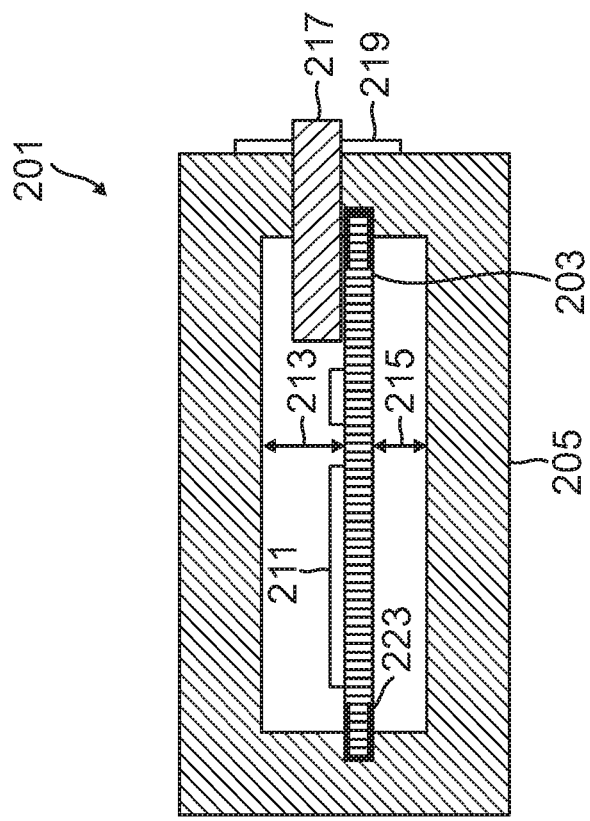
FIG. 2 is a cross-section diagram illustrating an electronic assembly mounted within a housing fabricated using an additive manufacturing process according to an aspect of the present disclosure.

FIG. 2 is a cross-sectional diagram of a system 201 where the housing 205 is manufactured using an additive manufacturing process. As illustrated, the system 201 may include an electronic assembly 203 incorporated within a housing 205. As described herein, the electronic assembly 203, containing electronic components 211, may function similarly to the electronic assembly 103 and the electronic components 111 described above in association with FIG. 1.

In certain embodiments, the housing 205 may be manufactured as a single component having the electronic assembly 203 and associated electronic components 211 embedded within the housing 205. For example, the housing 205 may be manufactured using an additive manufacturing process. Technologies used for additive manufacturing processes, also known as 3D printing, may describe methods for manufacturing objects by adding material to an object one layer at a time. For example, the housing 205 may be manufactured using any combination of different additive manufacturing technologies, which may include fused deposition modeling, stereolithography, digital light processing, selective laser sintering, material jetting, direct metal laser sintering, binder jetting, and the like. Additionally, the additive manufacturing technologies may use materials such as glass, metal (aluminum, titanium, etc.), plastics (thermoplastics, nylons, etc.), carbon fiber materials, elastomers, and the like.

In some embodiments, during the manufacturing of the housing 205, the electronic assembly 203 may be placed within the housing 205, such that the housing 205 is formed as a single component around the electronic assembly 203. Accordingly, the electronic assembly 203 may be environmentally protected within the housing 205. Further, as the housing 205 is formed as a single component around the electronic assembly 203, the housing 205 does not require additional material and size to facilitate the use of fastening devices to join different components together, such as the housing of FIG. 1 that includes a first component 105 and a second component 107 that are joined together through the use of fastening devices 109.

In additional embodiments, the electronic assembly 203 may be connected to a connector 217 that provides an electronic connection between the electronic assembly 203 and other potential electronic systems that are external to the housing 205. When the housing 205 is formed around the electronic assembly 203 and the connector 217, a sealant 219 may be applied around the portion of the connector 217 that extends through the housing 205, and any other openings on the housing 205, such that the electronic assembly 203 is sealed within the housing 205. Accordingly, the electronic assembly 203 may be environmentally protected from the environment external to the housing 205. For example, the sealant 219 may be a frit, an adhesive, an elastomeric material, solder, or other material capable of providing an environmental seal around the connector 217. Alternatively, the electronic assembly 203 may include electronic components 211 that facilitate wireless communication with electronic systems outside the housing 205. For example, the electronic components 211 may be capable of communicating using Wi-Fi, Bluetooth, BTLE, ZigBee, or other wireless communication standard.

In some embodiments, the electronic assembly 203 and electronic components 211 mounted on the electronic assembly 203 may be isolated from the material used in the additive manufacturing during the fabrication of the housing 205. For example, the electronic assembly 203 may have isolation portions 223 that mechanically interface with the housing 205. The isolation portions 223 may be formed of elastomeric material that is bonded to the edges of the electronic assembly 203. By using elastomeric material, the electronic assembly 203 may be permitted to move slightly within the housing 205 while maintaining the same relative position to the housing 205. In some embodiments, the portions of the housing 205 that come in contact with the isolation portions 223 may be formed to be sufficiently rough to increase the friction between the isolation portions 223 and the housing 205, such that the position of the electronic assembly 203 is more secure in relation to the position of the housing 205.

Alternatively, the isolation portions 223 may be formed from material that thermally isolates the electronic assembly 203 from the housing 205. By thermally isolating the electronic assembly 203 from the housing 205, the electronic assembly 203 may be protected from thermal damage that may result from the additive manufacturing process used to fabricate the housing 205.

In further embodiments, the electronic assembly 203 and electronic components 211 mounted on the electronic assembly 203 may be isolated from internal surfaces of the housing 205 by gaps formed between the electronic assembly 203 and internal surfaces of the housing 205. For example, the electronic assembly 203 may have an upper gap 213 and a lower gap 215, where the upper gap 213 separates one internal surface of the housing 205 from a surface of the electronic assembly 203 and the lower gap 213 separates an internal surface of the housing 205 that is opposite from the internal surface separated by the upper gap 213. By isolating the housing 205 from the electronic components 211 of the electronic assembly 203, the material used to fabricate the housing 205 does not interfere with the operation of the electronic components 211.

Figure 3:
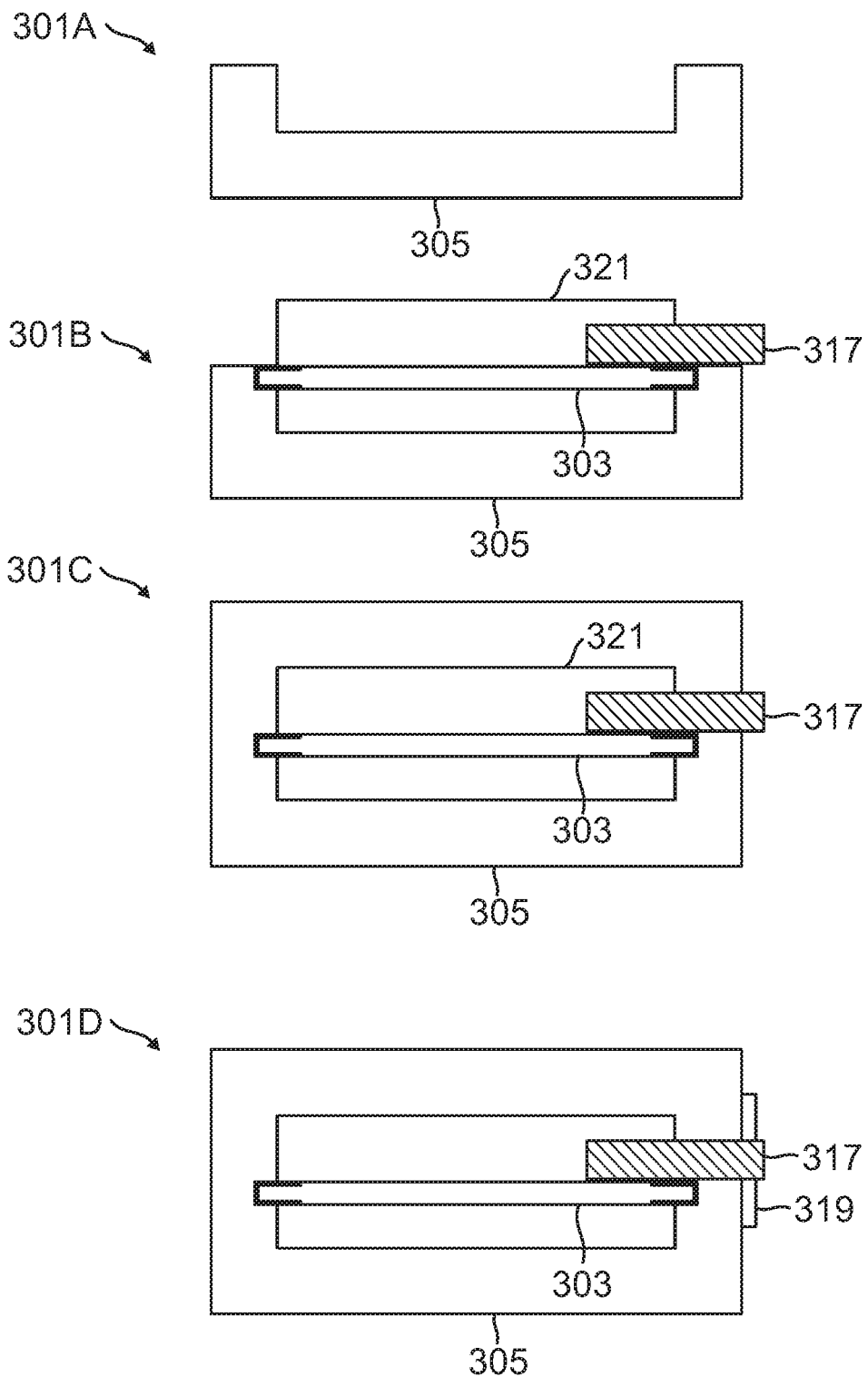
FIG. 3 is a cross-section diagram illustrating possible steps for mounting an electronic assembly within a housing fabricated using an additive manufacturing process according to an aspect of the present disclosure.

FIG. 3 is a diagram illustrating a fabrication process 301A-301D for a housing 305 and an electronic assembly 303 according to embodiments described herein. As shown, in fabrication step 301A, the housing 305 may be fabricated using an additive manufacturing process. At a predetermined time in the fabrication of the housing 305, the additive manufacturing process may be paused, such that an incomplete portion of the housing 305 is fabricated.

While the additive manufacturing process is paused, fabrication step 301B may be performed. During fabrication step 301B, separate components may be placed on the incomplete portion of the housing 305. For example, the electronic assembly 303 and connector 317 may be placed on the incomplete portion of the housing 305. In some implementations, an isolating structure 321 may be placed over an exposed portion of the electronic assembly 303, where the exposed portion of the electronic assembly 303 is opposite the side of the electronic assembly 303 facing the incomplete portion of the housing 305. In some implementations, the isolating structure 321 may be an object placed on a surface of the electronic assembly 303, where the additive manufacturing material may be placed over the isolating structure 321 to prevent the additive manufacture material from coming into contact with the electronic assembly 303.

In certain embodiments, when the electronic assembly 303, and accompanying components, are placed within the incomplete portion of the housing 305, the fabrication process may proceed at 301C. In fabrication step 301C, the additive manufacturing process resumes and the fabrication of the housing 305 is completed. As illustrated, the additive manufacturing process forms the housing 305 such that the electronic assembly 303 and the isolating structure 321 are contained within the housing 305. In implementations, where the electronic assembly 303 is coupled to a connector 317, the connector 317 may extend through the housing 305 to provide an electronic connection to the electronic assembly 303 for use by systems outside the housing 305. While embodiments described above are drawn to the embedding of a single electronics assembly 303 within a housing, the additive manufacturing process may be paused and resumed multiple times to embed multiple electronics assemblies within a housing 305.

As described above, the electronic assembly 303 may be securely located within the housing 305 and electronic components on the electronic assembly 303 may be isolated from materials used to make the housing 305. In some implementations, the electronic assembly 303 may communicate with external systems using wireless communications as described above. When the electronic assembly 303 communicates external systems using wireless communications, the housing 305 may entirely encapsulate the electronic assembly 303.

When the fabrication of the housing 305 is completed using the additive manufacturing process, the fabrication process may proceed at 301D. In some implementations, the isolating structure 321 may be removed from the inside of the housing 305, before the interior of the housing 305 is sealed from the external environment. For example, the housing 305 may be immersed within a solution that dissolves the isolating structure 321. Alternatively, the opening through which the connector 317 extends may provide access to the interior of the housing 305 such that the isolating structure 321 may be removed through the opening. Additionally, the isolating structure 321 may remain within the housing 305.

In some embodiments, the interior of the housing 305 may be sealed from external environments. To seal the interior of the housing 305, material may be applied around the connector 317. Examples of material useful for sealing the interior of the housing 306 may include a gel type material, an epoxy type material, a paste, a frit, or other material that could be applied to seal the interior of the housing 305. In some embodiments, where the housing 305 completely envelops the electronic assembly 303, an access point may be formed in the housing 305 during the additive manufacturing process that permits access to the electronic assembly 303 as needed during the lifecycle of the electronic assembly 303.

FIG. 4 is a diagram illustrating the use of particular device orientations to facilitate the fabrication of the housing 405 containing an electronic assembly 403 and the use of support materials during the additive manufacturing process. When implementing some additive manufacturing technologies, it may be difficult to fabricate horizontal structures that span a void. For example, some additive manufacturing processes may not be well suited for fabricating a section of the housing 405 that extends horizontally over a gap above the electronic assembly 403. Some additive manufacturing technologies may not be able to fabricate the section because there is no material to support the additive deposition of materials spanning the gap over the electronic assembly 403.

In some embodiments, to facilitate the fabrication of materials having gaps between surfaces, objects may be mounted on support material at an angle such that there is material to support the additional deposition of material throughout the additive manufacturing process.

In some embodiments, during an additive manufacturing process, objects may be manufactured upon a base support 433. Support material such as support columns 431 may be deposited on the base support 433. The support columns 431 may support the housing 405 during the additive manufacturing process. As shown, the housing 405 may be fabricated in an angular orientation with respect to the base support 433. By fabricating the housing 405 at an angular orientation, the layers of material applied during the additive manufacturing process may be supported by previously deposited material.

In certain embodiments, such as where the housing 405 is supported by support columns 431 or other support material, the housing 405 may be subject to postprocessing after the completion of the additive manufacturing process. During postprocessing, support material may be removed from the housing 405. For example, the support columns 431 may be separated from the housing 405. Additionally, some additive manufacturing processes may leave a rough surface on the housing 405. Accordingly, the external surfaces of the housing 405 may be polished to facilitate the mounting of the housing 405 within systems that incorporate the housing 405 and electronic assemblies within the housing 405. Also, the external surfaces of the housing 405 may be polished to improve the appearance of the housing 405.

As described above, by using additive manufacturing technologies to fabricate a housing 405 as a single component around an electronic assembly 403 such that the electronic assembly 403 is embedded within the housing 405, the size and weight of the housing 405 may be reduced. In particular, the size and weight of the housing 405 may be reduced because the housing 405 is a single component as compared to multiple components that are secured to one another using fastening devices. Thus, the electronic assembly 403 within the housing 405 may be used in a wider range of applications.

FIG. 5 is a flowchart diagram of a method 500 for embedding an electronic assembly within a housing using additive manufacturing technologies. Method 500 proceeds at 501, where the fabrication of the housing is performed using an additive manufacturing process. At a certain point during the fabrication of the housing, the method 500 proceeds at 503, where the additive manufacturing process is paused before completion of the fabrication of the housing. When the fabrication is paused, the method 500 proceeds at 505, where an electronics assembly is inserted within the housing. In some embodiments, the electronics assembly may engage with features of the housing such that the position of the electronics assembly is fixed in relation to the position of the housing. When electronics assembly is placed within the housing, the method 500 proceeds at 507, where the additive manufacturing process is resumed to complete the fabrication of the housing. Accordingly, the electronics assembly may be embedded within the housing such that the electronics assembly is environmentally protected by the housing from the environment that is outside the housing.

Example Embodiments

Example 1 includes a device comprising: a housing made using an additive manufacturing process; and at least one electronics assembly that is embedded into the housing during the additive manufacturing process, wherein one or more electronic components on the at least one electronic assembly are isolated from the material used to form the housing.

Example 2 includes the device of Example 1, wherein the one or more electronic components on the at least one electronic assembly provide inertial measurements.

Example 3 includes the device of any of Examples 1-2, wherein the one or more electronic components are mounted on a printed board assembly.

Example 4 includes the device of any of Examples 1-3, wherein the housing is made from at least one of: aluminum; titanium; thermoplastic material; elastomer; and carbon fiber material.

Example 5 includes the device of any of Examples 1-4, wherein a connector provides an electronic connection from at least one electronic component in the one or more electronic components to an electronic system that is outside the housing.

Example 6 includes the device of any of Examples 1-5, wherein at least one electronic component in the one or more electronic components is a wireless transceiver.

Example 7 includes the device of any of Examples 1-6, wherein the one or more electronic components are sealed within the housing from an environment outside the housing.

Example 8 includes the device of any of Examples 1-7, wherein the at least one electronic assembly comprises one or more elastomeric edges, wherein the elastomeric edges contact the housing.

Example 9 includes the device of any of Examples 8-9, wherein surfaces of the housing in contact with the elastomeric edges are substantially rough to inhibit movement of the at least one electronic assembly with respect to the housing.

Example 10 includes a method, comprising: performing fabrication of a housing using an additive manufacturing process; pausing the additive manufacturing process before completion of the fabrication of the housing; inserting at least one electronics assembly within the housing; and resuming the additive manufacturing process to complete the fabrication of the housing, such that the at least one electronics assembly is embedded within the housing.

Example 11 includes the method of Example 10, wherein one or more electronic components on the at least one electronics assembly are isolated from material used in the fabrication of the housing.

Example 12 includes the method of Example 11, wherein inserting the at least one electronics assembly within the housing further comprises inserting an isolation structure to isolate the one or more electronic components from the material during the additive manufacturing process.

Example 13 includes the method of Example 12, further comprising removing the isolation structure after the fabrication of the housing.

Example 14 includes the method of any of Examples 10-13, wherein inserting the at least one electronics assembly within the housing comprises connecting an electrical connection to at least one electronic component mounted on the at least one electronics assembly, wherein the electrical connection extends outside the housing after completion of the fabrication.

Example 15 includes the method of any of Examples 10-14, wherein performing the fabrication of the housing using an additive manufacturing process further comprises fabricating one or more support structures to support the fabrication of the housing in an angular position in relation to a base support.

Example 16 includes the method of Example 15, further comprising removing the housing from the one or more support structures.

Example 17 includes the method of any of Examples 10-16, further comprising: mounting the housing within a system; and electrically connecting one or more electronic components on the at least one electronics assembly to electronics within the system that are outside the housing.

Example 18 includes the method of any of Examples 10-17, further comprising sealing the at least one electronics assembly within the housing from an external environment of the housing.

Example 19 includes a system comprising: a housing made using an additive manufacturing process; at least one electronics assembly that is embedded into the housing during the additive manufacturing process, wherein one or more electronic components on the at least one electronic assembly are isolated from the material used to form the housing; and an electrical connector coupled to at least one electronic component in the one or more electronic components, wherein the electrical connector provides an electrical connection between the at least one electronic assembly and system electronics that are outside the housing, wherein the at least one electronic assembly is environmentally sealed within the housing from the environment outside the housing.

Example 20 includes the system of Example 19, wherein the electrical connector provides the electrical connection via at least one of: a wireless connection; and a physical connection.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A device comprising:
   a housing made using an additive manufacturing process; and
   at least one electronic assembly that is embedded into the housing during the additive manufacturing process, wherein one or more electronic components on the at least one electronic assembly are isolated from material used to form the housing, wherein the at least one electronic assembly comprises one or more elastomeric edges, wherein the one or more elastomeric edges contact the housing.

2. The device of claim 1, wherein the one or more electronic components on the at least one electronic assembly provide inertial measurements.

3. The device of claim 1, wherein the one or more electronic components are mounted on a printed board assembly.

4. The device of claim 1, wherein the housing is made from at least one of:
   aluminum;
   titanium;
   thermoplastic material;
   elastomer; and
   carbon fiber material.

5. The device of claim 1, wherein a connector provides an electronic connection from at least one electronic component in the one or more electronic components to an electronic system that is outside the housing.

6. The device of claim 1, wherein at least one electronic component in the one or more electronic components is a wireless transceiver.

7. The device of claim 1, wherein the one or more electronic components are sealed within the housing from an environment outside the housing.

8. The device of claim 1, wherein surfaces of the housing in contact with the one or more elastomeric edges are substantially rough to inhibit movement of the at least one electronic assembly with respect to the housing.

9. A system comprising:
   a housing made using an additive manufacturing process;
   at least one electronic assembly that is embedded into the housing during the additive manufacturing process, wherein one or more electronic components on the at least one electronic assembly are isolated from material used to form the housing, wherein the at least one electronic assembly comprises one or more elastomeric edges, wherein the one or more elastomeric edges contact the housing; and
   an electrical connector coupled to at least one electronic component in the one or more electronic components, wherein the electrical connector provides an electrical connection between the at least one electronic assembly and system electronics that are outside the housing, wherein the at least one electronic assembly is environmentally sealed within the housing from an environment outside the housing.

10. The system of claim 9, wherein the electrical connector provides the electrical connection via at least one of:
    a wireless connection; and
    a physical connection.

* * * * *